(12) United States Patent
Afghahi et al.

(10) Patent No.: US 6,288,666 B1
(45) Date of Patent: Sep. 11, 2001

(54) HIGH ACCURACY COMPARATOR

(75) Inventors: Morteza Afghahi, Mission Viejo, CA (US); Yueming He, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/436,073

(22) Filed: Nov. 8, 1999

(51) Int. Cl.$^7$ .................................. H03M 1/36
(52) U.S. Cl. ............................. 341/158; 327/52
(58) Field of Search .................. 341/158, 159; 327/52, 53, 54, 55, 56, 57

(56) References Cited

U.S. PATENT DOCUMENTS

| | | | |
|---|---|---|---|
| 4,408,133 | * 10/1983 | Cooperman et al. | 307/362 |
| 5,032,744 | * 7/1991 | Wai Yeung Liu | 307/491 |
| 5,274,275 | 12/1993 | Colles . | |
| 5,563,533 | * 10/1996 | Cave et al. | 327/67 |
| 5,912,567 | * 6/1999 | Drost et al. | 327/89 |
| 5,955,899 | * 9/1999 | Afghahi | 327/65 |
| 6,008,673 | * 12/1999 | Glass et al. | 327/77 |

OTHER PUBLICATIONS

Behzad Razavi & Bruce A. Wooley, "Design Techniques for High–Speed, High–Resolution Comparators"; IEE Journal of Solid State Circuits, vol. 27, No. 12.

Rudy van de Plassche, "Integrated Analog–To–Digital and Digital–To–Analog Converters", Kluwer Academic Publishers, pp. 126–129.

\* cited by examiner

*Primary Examiner*—Howard L. Williams
(74) *Attorney, Agent, or Firm*—Blakely, Sokoloff, Taylor & Zafman LLP

(57) ABSTRACT

An embodiment of the invention is directed to a metal oxide semiconductor field effect transistor (MOSFET) comparator, which includes a differential amplifier having first and second inputs and first and second outputs. A first offset storage device is connected to the first input at one end and receives a first input signal of the comparator at another end. A second offset storage device is connected to the second input at one end and receives the first input signal during an autozero time interval and a second input signal of the comparator thereafter. During the autozero time interval, offset voltages are stored. Thereafter, the offsets are cancelled when the input signals are applied to their respective storage device. In a particular embodiment of the invention, the amplifier features a dual purpose load that causes the amplifier to first preamplify and then regeneratively drives the outputs.

20 Claims, 5 Drawing Sheets

HIGH ACCURACY COMPARATOR

FIELD OF THE INVENTION

This invention is generally related to analog electronics and more particulary to comparators manufactured by a metal oxide semiconductor (MOS) process.

BACKGROUND

The comparator is an essential component of almost every mixed analog-digital circuit application. The ideal comparator should be small, fast, accurate, consume low power, and operate over a wide range of input signal level. A relatively small, fast, low power comparator that can be built using a MOS process is described in U.S. Pat. No. 5,274,275 issued to Colles ("Colles"). The Colles comparator features a single differential input stage with a dual purpose load. The load is under the control of an external signal. It allows the differential input stage to initially preamplify the input signals at the output of the input stage, and then operates as a regenerative latch to drive the output at a higher gain. The initial preamplify phase provides high accuracy by distinguishing between input signals that are relatively close in value, while the regenerative/latch phase completes the comparison at a greater speed.

One of the limitations of the Colles comparator is its relatively low accuracy, despite the use of the preamplify phase, due to offsets caused by device mismatching in the manufactured version of the circuit. In conventional comparators, various offset cancellation techniques are typically used to compensate for such offsets, and thereby enable the comparator to resolve a difference in the input signals which is smaller than the offset, thus yielding a "higher resolution" or more accurate comparison. Two of the most common approaches to offset cancellation are input offset storage and output offset storage. See Design *Techniques for High-Speed. High Resolution Comparators*, Razavi and Wooley, IEEE Journal of Solid-State Circuits, Vol. 27, No. 12, December 1992 ("Razavi"); *Integrated Analog-to-Digital and Digital-to-Analog Converters*, Rudy van de Plassche, Kluwer Academic Publishers, pp. 126–128 ("Plassche"). In both of these techniques, an offset voltage is sensed, stored, and then subtracted from the input to achieve cancellation.

Razavi discloses multi-stage comparators in which the output of a preamplifier stage is connected to an input of a latch, so that the comparator output is the latch output. Razavi, FIG. 1(a). The offset, which is a combination of the input offset of the preamplifier and the latch offset, is first stored on a pair of capacitors that are coupled to the inputs of the preamplifier at one end and to common ground at another, by closing a unity-gain loop around the preamplifier. The cancellation of offset is then performed by opening switches that connect one end of the capacitors to ground, and then applying the input signals to the capacitors. The offset previously stored in the capacitors is thus subtracted from the respective input signals, thus canceling the offset.

In Razavi, the input offset storage techniques are applied to multi-stage comparators as compared to the single stage, Colles comparator, the difference being that in Razavi the output of the comparator following the latch stage is not the same as the output of the preamplifier. Moreover, the offset cancellation techniques in Razavi may tend to inject excessive switch noise and ground noise into the storage capacitors via switches that connect one end of the capacitors to ground. This noise prevents the accurate capture of the true offset voltages.

SUMMARY

An embodiment of the invention is directed to a comparator which includes a differential amplifier having first and second inputs and first and second outputs. A first switch is to couple the first input to the first output. A second switch is to couple the second input to the second output. A first storage device is coupled to the first input at one end and is to receive a first input signal at another end. A second storage device is coupled to the second input at one end and is to receive at another end the first input signal during a first time interval. Thereafter, a second input signal to be compared with the first input signal is applied to the second storage device.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

A comparator is disclosed according to an embodiment of the invention that features an effective technique for canceling any offset that may appear in manufactured versions of the comparator. Storage devices coupled to the inputs of a differential amplifier receive the same first input signal at one end and their respective offset voltages at another, during an autozero time interval in which a unity gain loop is closed. This first input signal may be a reference signal to which a second input signal is being compared. Following the autozero interval, the storage devices receive their respective first and second input signals, and the unity-gain loop is broken, so that a difference between the two input signals, less the offset of the amplifier, can be amplified. In addition to providing a low noise offset cancellation technique, for greater accuracy such a comparator may compare input signals that are in the full rail-to-rail range. It should be noted that references to "an" embodiment in this disclosure are not necessarily to the same embodiment, and they mean at least one.

In a particular version of the invention, the amplifier has a dual purpose load and operates in two phases, a preamplify interval and a subsequent, high gain interval, for greater accuracy and a speedier comparison. The offset cancellation technique described above is also effective to compensate for the offset of a latch circuit that is part of the dual purpose load, as used in the Colles comparator. This version is particularly effective when implemented using a metal oxide semiconductor (MOS) fabrication process due to its compact design.

Figure 1:
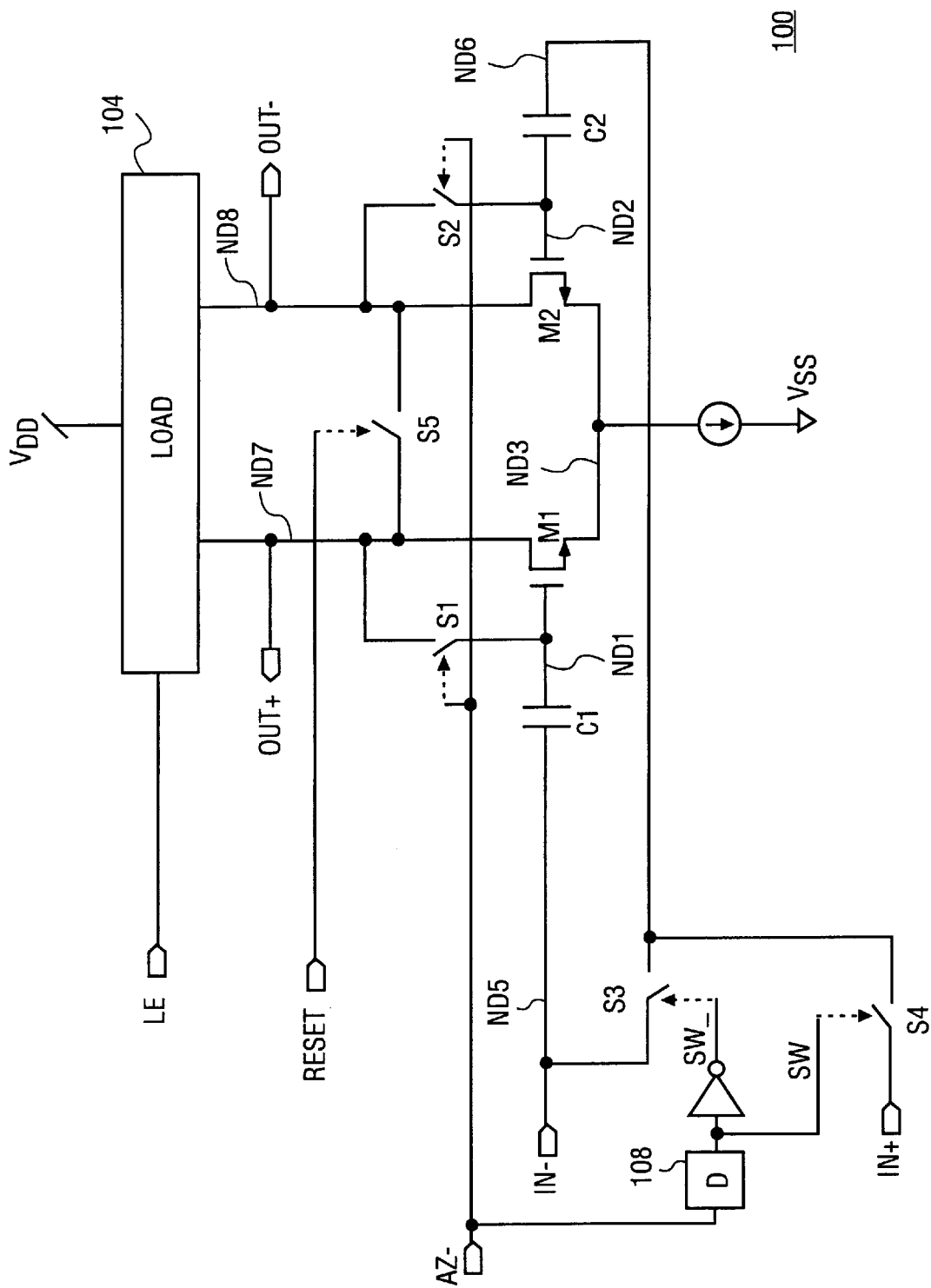
FIG. 1 shows a circuit schematic of an embodiment of the invention.

FIG. 1 illustrates an embodiment of the invention as a comparator 100. This embodiment includes a differential amplifier featuring MOS field effect transistors (FETs) M1 and M2, configured as a differential transistor pair whose source connections are shorted to a common node ND3. A current path is provided between node ND3 and a power supply node Vss. In this embodiment, Vss is at 0 volts (ground), whereas the other power supply node is at a positive voltage Vdd. A load circuit 104 is coupled between the power supply node Vdd and the first and second output nodes ND8 and ND7, respectively. The inputs of the differential transistor pair are at the gates of M1 and M2, namely nodes ND1 and ND2, respectively. First and second switches S1 and S2 provide a conductive path between ND1 and ND7, and ND2 and ND8, respectively, when the switches are closed. S1 and S2 are closed in response to an external control signal AZ_ (derived from an autozero signal AZ). The closing of switches S1 and S2 closes a unity-gain loop around each half of the differential amplifier. First and second storage devices C1 and C2 are coupled to their respective input nodes ND1 and ND2 on one end and to nodes ND5 and ND6 at the other ends. ND5 receives the first input signal IN− while ND6 alternatively receives IN− and the second input signal IN+. ND6 is alternatively connected to the different input signals through switches S3 and S4 which are controlled by complimentary signals SW_ and SW. These complimentary signals may be derived from AZ_, preferably following through an optional delay block 108. The delay block 108 helps obtain further accuracy by allowing switching noise (caused by S1 and S2) that may have been introduced into C1 and C2 to dissipate before the comparison actually begins when S3 has opened and S4 has closed. In addition, the delay block 108 helps avoid disturbing the sampled offsets on C1 and C2 through coupling from IN+. The signals OUT− and OUT+ at their respective nodes ND8 and ND7 provide the result of the comparison. A switch S5 between ND7 and ND8 is also provided to equalize the output nodes prior to making each comparison, in response to an external RESET signal.

Figure 2:
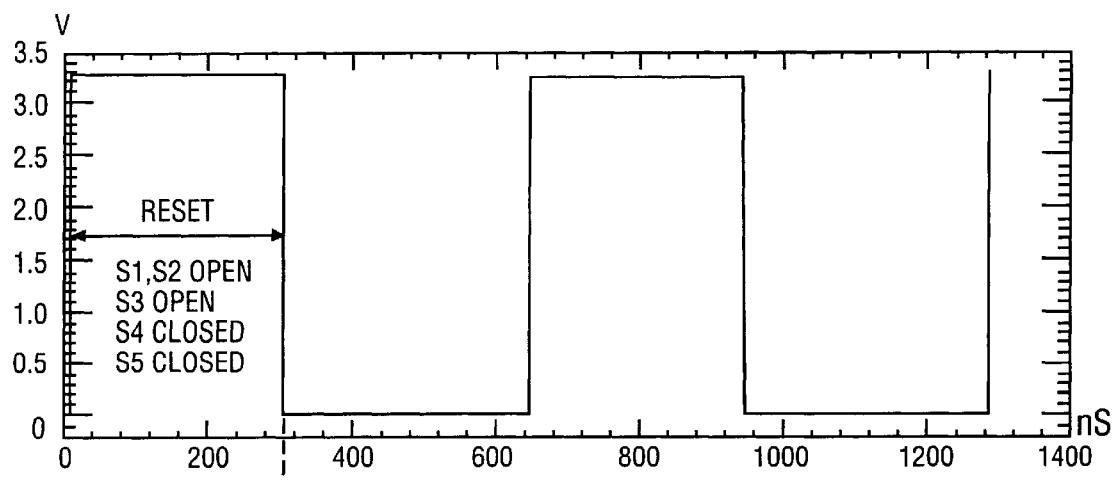
FIG. 2 is a plot of a reset signal for equalizing the output of a differential amplifier.
Figure 3:
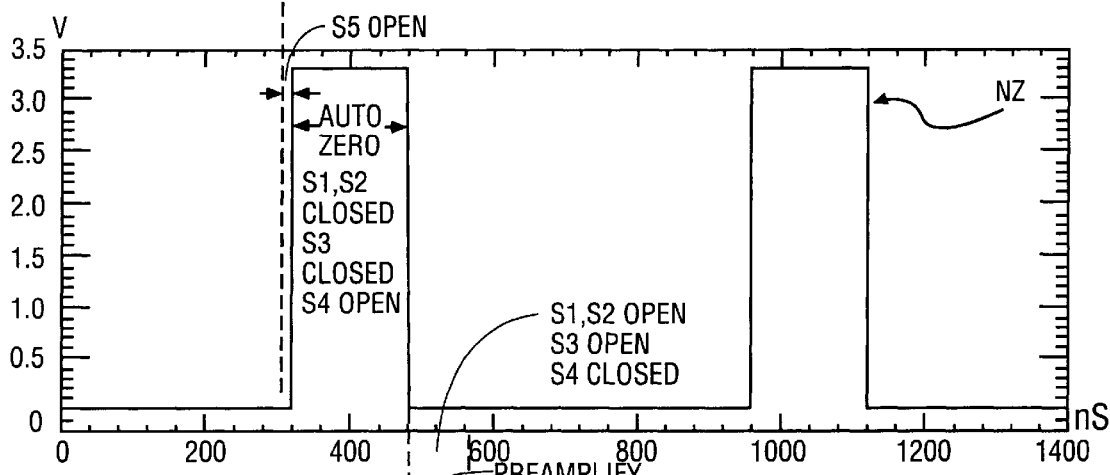
FIG. 3 shows a plot of an autozero control signal for use with an embodiment of the invention.
Figure 4:
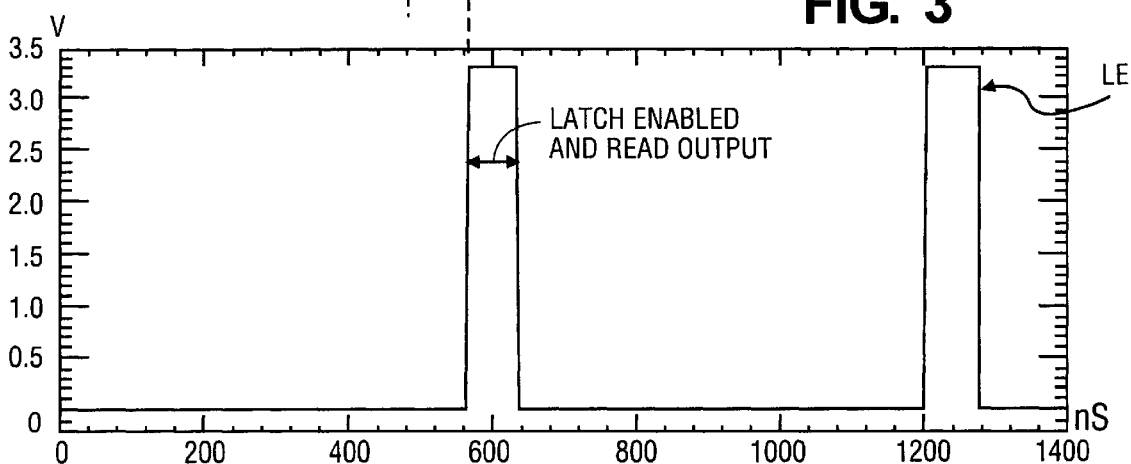
FIG. 4 depicts a latch enable control signal for use with an embodiment of the invention.

Having described the structure of the comparator 100 according to an embodiment of the invention, an exemplary technique for performing comparisons using the comparator 100 is now described. FIGS. 2–4 show plots of various control signals versus time in which repeated comparisons are made. The times given below are only exemplary and the invention is not limited to these intervals. An exemplary comparison cycle begins with a reset interval as shown in FIG. 2. With the comparator being powered up, during the reset interval, the autozero signal AZ (FIG. 3) and the latch enable signal LE are both low. With RESET being high, switch S5 is closed thus equalizing nodes ND7 and ND8. With AZ being low, AZ_ is high, so that switches S1 and S2 are open. Referring back to FIG. 1, this switch configuration causes the differential amplifier to operate in open loop fashion and settles to some unknown voltage at nodes ND7 and ND8. Thus, the input signals IN− and IN+ are applied to nodes ND5 and ND6, respectively. This situation continues through the reset interval until just before the 320 nanosecond mark.

Just before the 320 nanosecond mark in FIG. 2, RESET is deasserted and brought low, thus opening switch 55 (indicated in FIG. 3). Following a relatively short delay, AZ is asserted at approximately the 320 nanosecond mark, which marks the start of the autozero interval and which immediately causes switches S1 and S2 to close. The slight delay between the opening of S5 and the closure of S1 and S2 allows any charge injection due to the opening of switch S5 to dissipate and thereby not contribute to the offset voltage which is subsequently obtained at nodes ND1 and ND2. The differential amplifier is now operating as a unity-gain closed loop amplifier on both sides of the differential transistor pair. This in turn allows C1 and C2 to simultaneously capture the offset of the differential amplifier (including any offset introduced by the load 104 and by the input pairs M1 and M2), i.e., $V_{os1}$ at ND1 and $V_{os2}$ at ND2.

After the predetermined delay 108 following the transition of AZ, the signals SW and SW_ will transition so that S3 is closed and S4 is open as indicated in FIG. 4. During the autozero interval, the input signal IN− is applied to both ND5 and ND6, such that $(IN-)-V_{OS1}$ is developed on C1, and $(IN-)-V_{OS2}$ is developed on C2. These voltages will stabilize by the end of the autozero interval at the 480 nanosecond mark.

At the end of the 480 nanosecond mark, AZ is deasserted, thereby causing switches S1 and S2 to open. The latter event releases the differential amplifier into open loop mode and allows the difference between the voltages at ND1 and ND2 to be amplified. Following the delay 108, switches S3 and S4 are toggled so that node ND6 receives the input signal IN+. Configured in this fashion, the output of the differential amplifier during the preamplify interval is given by $$V_{out} \propto [(OUT+)-(OUT-)]$$
$$\propto (IN+)-[(IN-)-V_{OS2}]-\{(IN-)-[(IN-)-V_{OS1}]\}$$
$$\propto (IN+)-(IN-)+V_{OS2}-V_{OS1}$$

resulting in the cancellation of the offset voltages $V_{OS1}$ and $V_{OS2}$ at the output of the differential amplifier. The manner in which the storage devices C1 and C2 are coupled to the input nodes ND5 and ND6 may lead to reduced ground noise being introduced into the offset cancellation scheme, thus allowing a more accurate comparison.

In another embodiment of the invention, the impedance of the load 104 that is coupled to the output nodes ND7 and ND8 of the differential amplifier is changed by an external control signal, after the preamplify interval has ended, to speed up the comparison. Referring now to FIG. 4, at the end of the preamplify interval, a latch enable (LE) signal is asserted which enables a circuit in the load 104 that configures the differential amplifier with, in effect, a second gain which is substantially greater than the gain exhibited in the preamplify interval. The increased gain permits the output voltage of the comparator at nodes ND7 and ND8 to be driven to opposite extremes in a relatively short period of time, thus contributing to a speedy comparison. The results of the comparison are available at the output nodes ND7 and ND8 sometime during the "latch interval" which follows the preamplify interval as shown in FIG. 4 between the 560 and 640 nanosecond marks. After the output signal has been read, the load 104 is reconfigured back to the preamplify configuration, and the cycle beginning with assertion of the RESET signal can resume after the 640 nanosecond mark in preparation for the next comparison.

Figure 5:
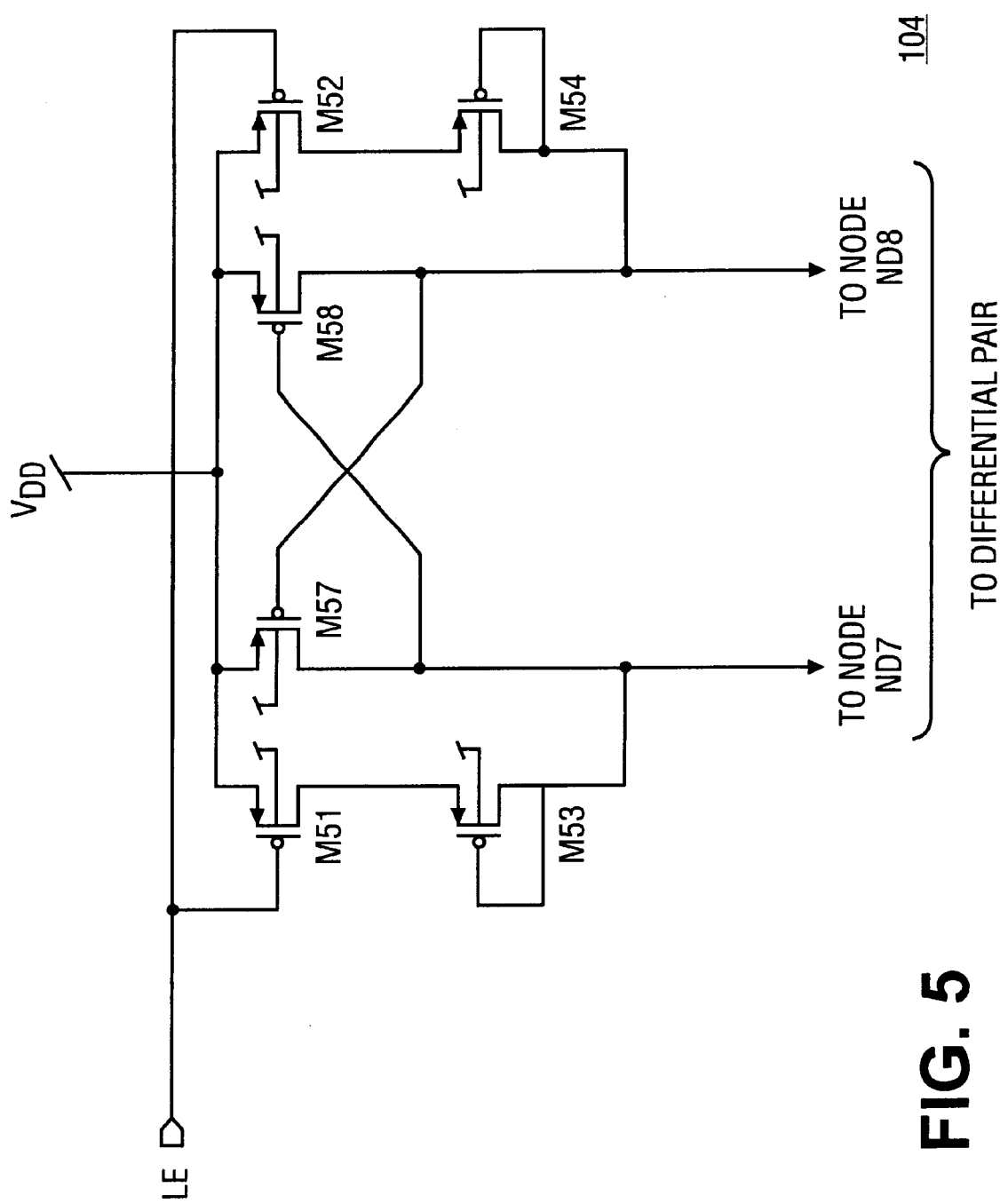
FIG. 5 illustrates a circuit schematic of a preamplifier/latch load for a differential amplifier.

FIG. 5 shows an exemplary circuit schematic for the load 104. A pair of switches M51 and M52 receive the external LE control signal. When LE is asserted, the transistors M51 and M52 essentially cut off current to their respective diode devices M53 and M54. This in turn allows the cross-coupled pair of M57 and M58 to regeneratively drive nodes ND7 and ND8. On the other hand, when the LE signal is deasserted, transistors M51 and M52 substantially conduct and create respective bypass paths between nodes ND7 and ND8 and the positive power supply node Vdd. With the bypass paths conducting in this way, the impedance presented to nodes ND7 and ND8 is changed such that the gain of the differential amplifier (see M1 and M2 in FIG. 1) is in effect reduced. In addition, the cross-coupled pair M57–M58 are prevented from regeneratively driving the output nodes, ND7 and ND8. This allows the differential pair M1 and M2 to amplify a smaller difference between the input signals IN+ and IN− during the preamplify interval, yielding a more accurate comparator.

In addition, when the LE signal is deasserted and the load is not operative regeneratively, its offset is easily captured. In contrast, this offset could not be captured if the load were always configured to behave regeneratively. Thus, an advantage of this embodiment of the invention is its ability to capture the offset of a latch while the latch is still connected as a load of the differential input pair.

Figure 6:
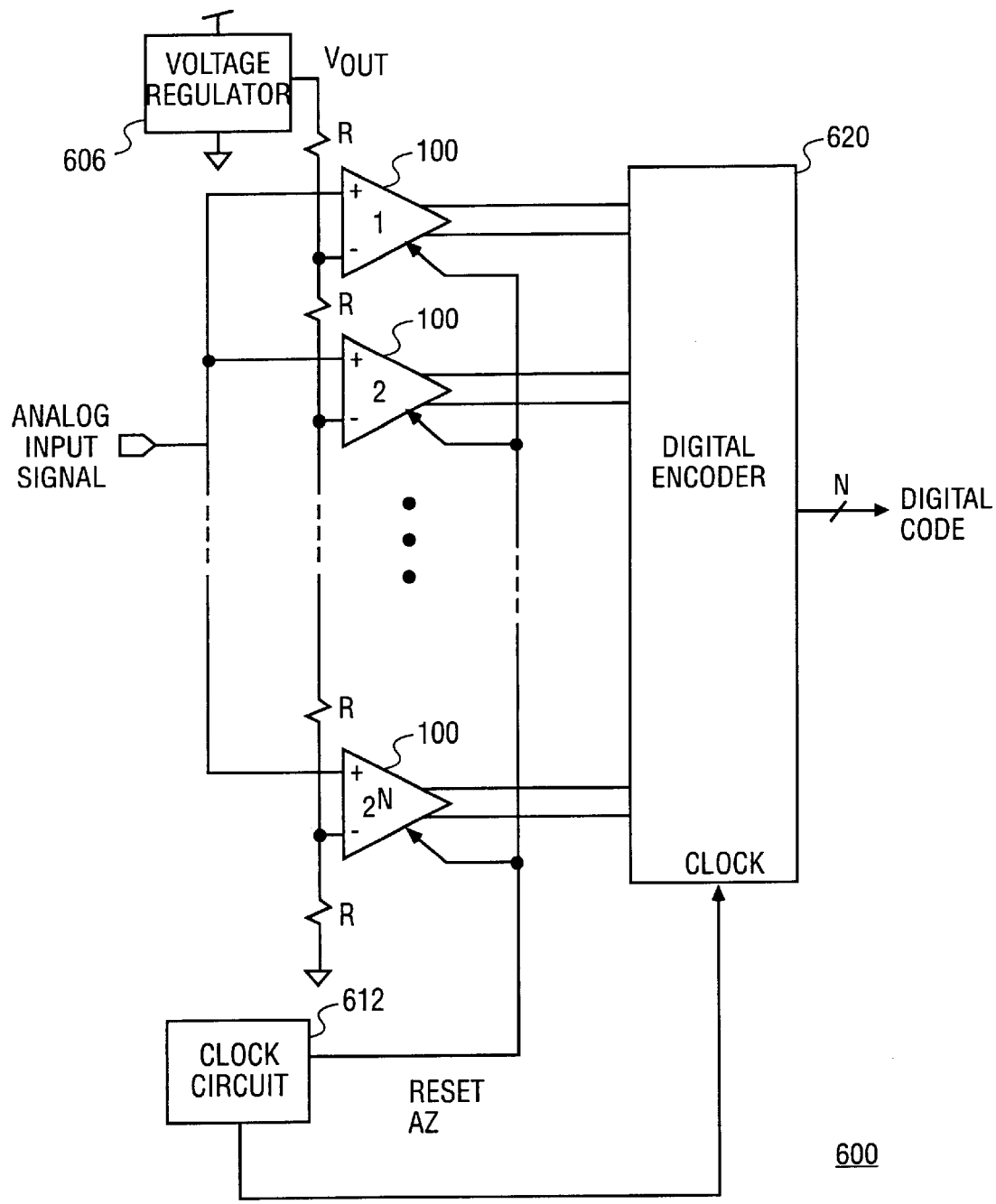
FIG. 6 depicts a block diagram of an analog to digital converter featuring a comparator.

The comparators described above may be used in a variety of different circuit applications, including for instance clock recovery circuits, temperature sensors, and analog to digital (A/D) converters. FIG. 6 illustrates an exemplary application being a parallel analog to digital converter 600. This N bit converter includes a voltage regulator whose output Vout feeds a resistor ladder network. Each potential on the resistor ladder network is a unique voltage level which is fed to the inverting input of a respective comparator 100. The non-inverting input of each comparator 100 receives the analog input signal. A clock circuit 612 provides a periodic waveform which defines a series of pulses, including the RESET, AZ, and perhaps LE signals, that are fed to each comparator 100. The result of the comparison is latched and read by the digital encoder 620. The digital encoder 620 then translates the "thermometer" output from the comparator 100 into an N-bit digital code. The digital code is updated at the clock frequency of 1/T. Other conventional A/D converter applications for the comparator 100 include sigma-delta converters.

Figure 7:
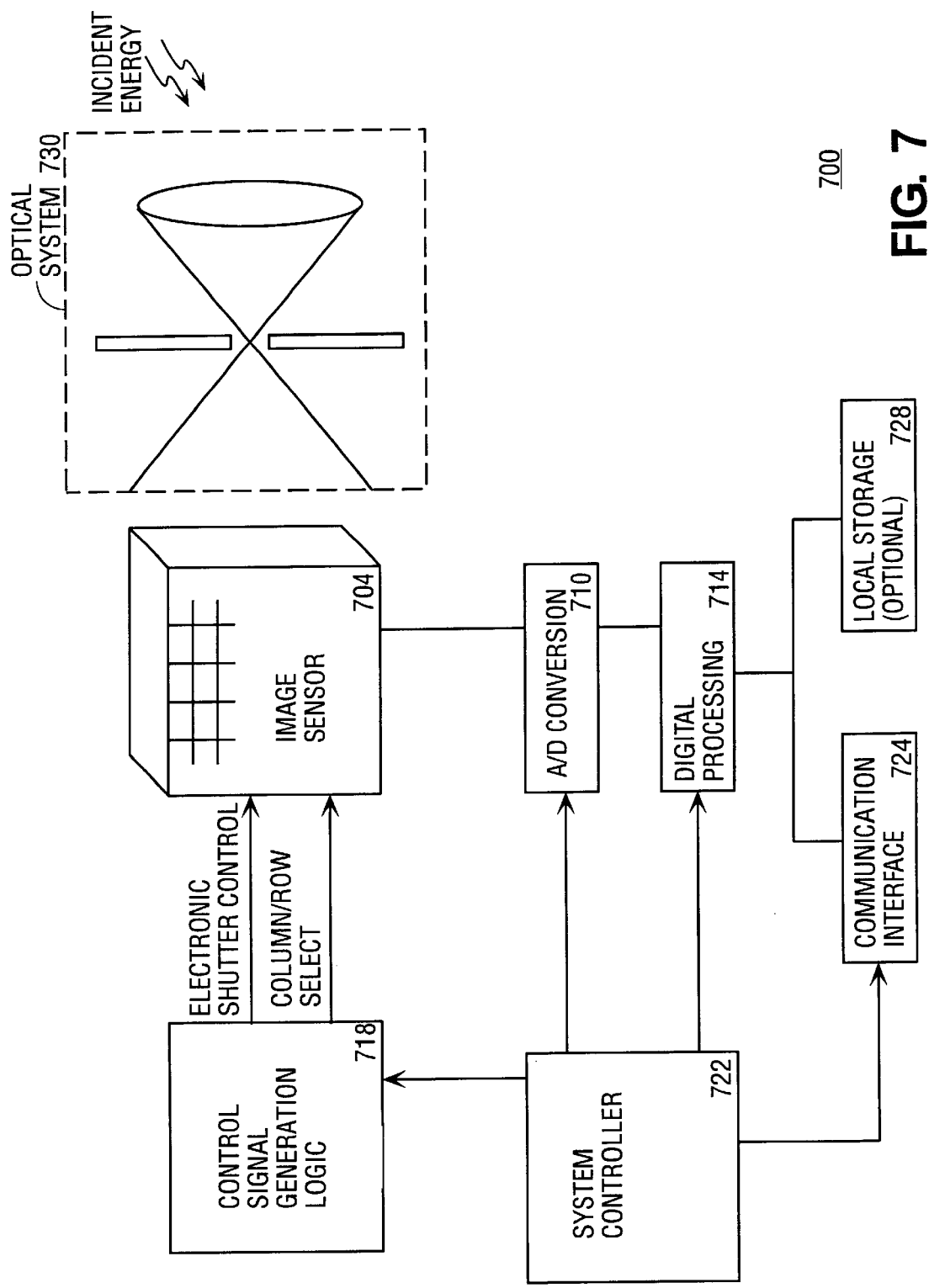
FIG. 7 illustrates a system application of the analog to digital converter according to an embodiment of the invention.

The A/D converter 600 and its alternatives described above may be used as part of a digital imaging system 700 shown in functional block diagram form in FIG. 7. The imaging system 700 has an optical system 730 that channels incident energy, being visible light in one case, to create an optical image on an image sensor chip 704. Control signal generation circuitry 718 is provided to generate electronic shutter control signals and row/column select lines needed to control the photocells of the image sensor. Sensor signals are then further processed by an A/D conversion unit 710 which digitizes the sensor signals and feeds a digital processing block 714. The A/D conversion unit 710 may include one or more of the A/D converters 600 to digitize the sensor signals received over each bitline of the image sensor 704. The bitlines may be multiplexed to a single A/D converter 600, or they may each have a dedicated respective A/D converter 600. The A/D unit 710 and portions of the digital processing block 714 may be located on the same die as the image sensor 714. The digital processing may be done by hardwired logic and/or a programmed processor that performs a variety of digital image processing functions, including perhaps preparing compressed digital image data based on the sensor signals for more efficient storage or transmission.

Transmission of the image data to an external processing system such as a stand alone personal computer may be accomplished using the communication interface 724. For instance, as a digital camera, the communication interface implements a computer peripheral bus standard such as universal serial bus (USB) or a high speed serial bus protocol. The imaging system 700 as a digital camera may also contain a local storage 728 of the non-volatile variety, for instance including a solid state memory such as a removable memory card, a rotating magnetic disk device, or other suitable memory device for permanent storage of digital image data. The operation of the system 700 id may be orchestrated by a system controller 722 which may include a conventional microcontroller responding to instructions stored as firmware.

To summarize, various embodiments of the invention have been described that are directed to an improved single stage comparator that is both compact and exhibits high accuracy, featuring an effective offset cancellation technique that captures the offset of both the differential input pair and a latch-type load. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A comparator comprising:
   differential amplifier having first and second inputs and first and second outputs;
   first switch to couple the first input to the first output through a low impedance path;
   second switch to couple the second input to the second output through a low impedance path;
   first storage device coupled to the first input at one end and to receive a first input signal at another end;
   second storage device coupled to the second input at one end and to receive, at another end, the first input signal during a first time interval and thereafter a second input signal to be compared with the first input signal; and
   a load coupled between the first and second outputs and a power node, the load includes a cross coupled pair of transistors to regeneratively drive the first and second outputs, and first and second bypass paths coupled between the first and second outputs, respectively, and the power node, the bypass paths to conduct in response to a control signal being asserted and thereby prevent the cross coupled pair from operating regeneratively.

2. The comparator of claim 1 wherein the load is configured so that the differential amplifier amplifies a difference between the first and second input signals according to a first gain during a preamplify interval and according to a second gain during a subsequent time interval, the second gain being greater than the first gain, the preamplify and subsequent intervals occurring subsequent to the first interval.

3. The comparator of claim 2 wherein the transition from the first gain to the second gain is in response to the control signal being deasserted after the preamplify interval.

4. The comparator of claim 2 wherein a result of a comparison between the first and second input signals becomes available at the first and second outputs in the subsequent interval.

5. The comparator of claim 1 wherein the first time interval is defined by an autozero pulse signal that controls the first and second switches.

6. The comparator of claim 5 further comprising:
   third switch for applying the first input signal to the second storage device through a low impedance path; and
   fourth switch for applying the second input signal to the second storage device through a low impedance path, the third and fourth switches being controlled by complementary pulses.

7. The comparator of claim 6 wherein the complementary pulses are derived from the autozero pulse signal.

8. The comparator of claim 1 wherein the first input signal is a reference signal.

9. The comparator of claim 1 wherein the differential transistor pair is implemented by MOSFETs.

10. A comparator circuit comprising:
    differential amplifier having first and second inputs and first and second outputs;
    load coupled between the first and second outputs and a power node, the load includes a cross coupled pair of transistors to regeneratively drive the first and second outputs, and first and second bypass paths coupled between the first and second outputs, respectively, and the power node, the bypass paths to conduct in response to a control signal being asserted and thereby prevent the cross coupled pair from operating regeneratively;
    first switch to provide a low impedance path between the first input and the first output;
    second switch to provide a low impedance path between the second input and the second output;
    first storage device coupled to the first input at one and to receive a first input signal at another end;
    selector circuit to receive the first input signal and a second input signal and having an output to provide one of the first and second input signals; and
    second storage device coupled to the second input at one end and to the selector circuit output at another.

11. The comparator of claim 10 wherein the cross coupled pair includes p-channel MOSFETs, the differential amplifier includes n-channel MOSFETs, and the power node is at a positive voltage.

12. The comparator of claim 10 wherein the selector circuit includes:
    third switch for applying the first input signal to the selector circuit output through a low impedance path; and
    fourth switch for applying the second input signal to the selector circuit output through a low impedance path, the third and fourth switches to be controlled by complementary pulses.

13. The comparator of claim 12 further comprising:
    fifth switch for equalizing the first and second outputs in response to a control signal being asserted.

14. A method comprising:
    applying a first input signal to a first storage device and a selector circuit of a comparator, the comparator comprising differential amplifier having first and second inputs and first and second outputs, load coupled between the first and second outputs and a power node, the load includes a cross coupled pair of transistors to regeneratively drive the first and second outputs, and first and second bypass paths coupled between the first and second outputs, respectively, and the power node, the bypass paths to conduct in response to a control signal being asserted and thereby prevent the cross coupled pair from operating regeneratively, first switch to provide a low impedance path between the first input and the first output, second switch to provide a low impedance path between the second input and the second output, first storage device coupled to the first input at one and to receive a first input signal at another end, selector circuit to receive the first input signal and a second input signal and having an output to provide one of the first and second input signals, and second storage device coupled to the second input at one end and to the selector circuit output at another;
    applying the second input signal to the selector circuit;
    generating a first pulse to control the first and second switches, the switches providing said low impedance paths while the first pulse is asserted;
    generating a second pulse to control the selector circuit, the selector circuit output providing the first input signal while the second pulse is asserted and the second input signal while the second pulse is deasserted; and
    reading a voltage between the first and second outputs of the differential amplifier following the first pulse and the second pulse being deasserted.

15. The method of claim 14 wherein the second pulse is derived from the first pulse following a predetermined delay.

16. The method of claim 14 wherein the first pulse is applied directly to the first and second switches.

17. An analog to digital converter comprising:
    a voltage regulator including a reference circuit to provide an input reference voltage;
    a resistor ladder network coupled at one end to the voltage regulator and at another to a power node;
    a plurality of comparators each having a first input coupled to a separate point of the resistor ladder network and a second input to receive an input analog signal to be converted into a digital code, each comparator including:
        differential amplifier having first and second inputs and first and second outputs, load coupled between the first and second outputs and a power node, first switch to provide a low impedance path between the first input and the first output, second switch to provide a low impedance path between the second input and the second output, first storage device coupled to the first input at one and to receive a first input signal at another end, selector circuit to receive the first input signal and a second input signal and having an output to provide one of the first and second input signals, second storage device coupled to the second input at one end and to the selector circuit output at another, and a load coupled between the first and second outputs and a power node, the load includes a cross coupled pair of transistors to regeneratively drive the first and second outputs, and first and second bypass paths coupled between the first and second outputs, respectively, and the power node, the bypass paths to conduct in response to a control signal being asserted and thereby prevent the cross coupled pair from operating regeneratively;
    digital encoder to translate the outputs of the comparators into an N-bit digital code; and
    a clock circuit to generate pulses to latch the outputs of the sense amplifiers and enable the digital encoder to update the code.

18. An imaging system comprising:
    an image sensor having a plurality of photocells, the photocells to provide sensor signals in response to incident light and according to control signals,
    control circuitry configured to generate the control signals for controlling the image sensor;
    analog to digital conversion unit to digitize the sensor signals, including at least one analog to digital converter having a voltage regulator including a reference circuit to provide an input reference voltage, a comparator having a first input to receive a voltage derived from the reference voltage and a second input to receive one of the sensor signals, the comparator including differential amplifier having first and second inputs and first and second outputs, load coupled between the first and second outputs and a power node, the load includes a cross coupled pair of transistors to regeneratively drive the first and second outputs, and first and second bypass paths coupled between the first and second outputs, respectively, and the power node, the bypass paths to conduct in response to a control signal being asserted and thereby prevent the cross coupled pair from operating regeneratively, first switch to provide a low impedance path between the first input and the first output, second switch to provide a low impedance path between the second input and the second output, first storage device coupled to the first input at one and to receive a first input signal at another end, selector circuit to receive the first input signal and a second input signal and having an output to provide one of the first and second input signals, and second storage device coupled to the second input at one end and to the selector circuit output at another;

the amplifier makes a comparison between signals at the first and second inputs towards quantizing the sensor signal;

digital encoder to translate the quantized sensor signal into an N-bit digital code; and signal processing circuitry to generate image data in response to the digital code.

19. The imaging system of claim 18 further comprising:

system controller to control operation of the imaging system including the signal processing circuitry and the A/D conversion unit.

20. The imaging system of claim 18 further comprising:

optical system configured to receive the incident light to form an image on the image sensor; and communication interface to transfer the image data to a stand alone image processing and display system separate from the imaging system.

* * * * *

UNITED STATES PATENT AND TRADEMARK OFFICE
CERTIFICATE OF CORRECTION

PATENT NO. : 6,288,666 B1
DATED : September 11, 2001
INVENTOR(S) : Afghani et al.

It is certified that error appears in the above-identified patent and that said Letters Patent is hereby corrected as shown below:

Column 1,
Line 6, delete "particularly", insert -- particularly --.

Column 3,
Line 61, delete "55", insert -- S5 --.

Column 6,
Line 5, delete "id".

Signed and Sealed this

Fourth Day of June, 2002

Attest:

JAMES E. ROGAN
Attesting Officer    Director of the United States Patent and Trademark Office